United States Patent [19]

Matsuda et al.

[11] Patent Number: 4,980,310
[45] Date of Patent: Dec. 25, 1990

[54] METHOD OF MAKING A TRENCH DRAM CELL

[75] Inventors: Yoshio Matsuda; Kazuyasu Fujishima, both of Hyogo, Japan

[73] Assignee: Mitsubishi Denki Kabushiki Kaisha, Tokyo, Japan

[21] Appl. No.: 412,742

[22] Filed: Sep. 26, 1989

Related U.S. Application Data

[62] Division of Ser. No. 110,462, Oct. 20, 1987, Pat. No. 4,887,137.

[30] Foreign Application Priority Data

Oct. 20, 1986 [JP] Japan .................. 61-250162

[51] Int. Cl.$^5$ ............................. H01L 21/70
[52] U.S. Cl. .................... 437/52; 437/38; 437/47; 437/60; 437/203; 437/919
[58] Field of Search .............. 437/47, 38, 60, 52, 437/67, 203, 228; 357/23.6; 365/186

[56] References Cited

U.S. PATENT DOCUMENTS 4,369,564  1/1983  Hiltpold ..................... 437/52

FOREIGN PATENT DOCUMENTS 58-12739   3/1983  Japan .
59-136256  12/1984 Japan .
12752      1/1985  Japan ..................... 437/919
61-187263  8/1986  Japan .

OTHER PUBLICATIONS

"Subthreshold Conduction in MOSFET's", Geoffrey W. Taylor, IEEE Transactions on Electron Devices, vol. ED-26, No. 3, Mar. 1978.

Primary Examiner—Brian E. Hearn
Assistant Examiner—T. Thomas
Attorney, Agent, or Firm—Lowe, Price, LeBlanc, Becker & Shur

[57] ABSTRACT

A dynamic semiconductor memory device comprising a substrate having one trench including two capacitors for memory cell capacitances of two bits, and two elements such as transistors for reading, writing, and storing information represented by charge, arranged symmetrically at the central portion of the trench so as to correspond to the memory cells for two bits, and a field oxide film formed at the center of the trench on the bottom and on the side walls for separating the capacitors and elements.

14 Claims, 6 Drawing Sheets

METHOD OF MAKING A TRENCH DRAM CELL

This application is a division of application Ser. No. 110,462 filed Oct. 20, 1987, now U.S. Pat. No. 4,887,137.

BACKGROUND OF THE INVENTION

1. Field of the Invention

The present invention relates to a dynamic semiconductor memory device and more specifically it relates to a semiconductor memory device which is suitable for high integration.

2. Description of the Prior Art

A dynamic semiconductor memory device has been widely known. FIG. 1 is a block diagram showing the whole structure of a conventional dynamic semiconductor memory device.

Referring to FIG. 1, the dynamic semiconductor memory device comprises an array including a plurality of memory cells constituting a memory portion, a X decoder and a Y decoder for selecting the address thereof and an input/output interface portion including a sense amplifier connected to an input/output buffer. The plurality of memory cells constituting the memory portion are connected to each of intersections of the word lines connected to the X decoder and the bit lines connected to the Y decoder structured in a matrix, thereby forming the said array.

The operation will be hereinafter described. In response to an externally applied row address signal and column address signal, that memory cell is selected which is at the intersection of one word line and one bit line, each of which is selected by the X decoder and the Y decoder and the information is read out or written into the memory cell through the input/output buffer and the input/output interface portion including the sense amplifier.

Generally, as a semiconductor memory device especially a dynamic semiconductor memory device comes to be more highly integrated, the area occupied by the memory cells, constituting the information storing portion, tends to be smaller. In order to secure as much capacitance as possible in a limited area, various types of memory cells have been proposed. For example, FIG. 2A shows a plan view of a conventional semiconductor memory device in which a fine aperture, which may be referred to as a trench region, is formed in a semiconductor substrate and the side wall thereof is used as a capacitor portion to provide sufficient capacitance (for example, Patent Publication Gazette 12739/1983). FIG. 2B is a cross sectional view taken along the line IIB—IIB of FIG. 2A.

FIG. 3A is a plan view showing a semiconductor memory device arranged to be suited for a folded bit line structure, FIG. 3B is a cross sectional view taken along the line IIIB—IIIB of FIG. 3A and FIGS. 4A to 4C are cross sectional views showing the manufacturing method of the semiconductor memory device.

Referring to the figures, trench regions 10 and 11 which are used to form capacitors for storing information-representing charge are formed on the main surface of a p+ substrate 1 each in a trench form and to be juxtaposed each other. A capacitor region is formed by an impurity doped layer 6a and a cell plate 4 with a capacitor insulating film 5 interposed therebetween. The two juxtaposed trench regions 10 and 11 are separated by a separating region 2, and below the separating region 2 an inversion preventing layer 3 is formed for preventing inversion. Drain and source regions 6b of transistors are formed by the sides of the trench regions 10 and 11 opposite to the separation region. Above a channel region which is between the source and drain regions 6b, word lines 8a to 8d are formed through a gate insulating film 12. These word lines 8a to 8d and the capacitor electrode 4 are covered with an oxide film 12 and the bit lines formed on the oxide film 12 are connected to the source regions 6b of the transistors through a contact hole 13. Meanwhile, in the plan views such as FIGS. 2A and 3A, the Al bit lines 7 are omitted.

In such semiconductor memory device as described above, a trench region is formed in a semiconductor substrate and the sides and the bottom thereof are used as a portion for storing electric charge representing information in order to substantially increase the area.

The method for manufacturing the above described conventional semiconductor memory device will be described with reference to FIGS. 4A to 4C. First, boron is ion implanted into that portion which is to be an element-separating region, so that a p+ type channel stop region 3 for separating elements is formed, and then a field oxide film 2 is formed (FIG. 4A). Then trench regions 10 and 11 are formed and by arsenic ion implantation, for example, a n+ type diffusion region 6a which is to be a charge storing region is formed (FIG. 4B). Next, a first polysilicon layer 4 which is to be a cell plate is formed and a silicon oxide film 12 is deposited thereon by, for example, a chemical vapor deposition (CVD) method and word lines 8a to 8d are formed by a second layer of polycrystalline silicon (FIG. 4C). Subsequently, a n+ diffusion layer 6b is formed and an insulating layer of for example phosphosilicate glass is formed. Thereafter a contact hole 9 is formed and an Al wire 7 is provided to obtain the conventional semiconductor memory device shown in FIGS. 3A and 3B.

The conventional semiconductor memory device is structured as described above. In order to realize higher integration, the space between the trenches 10 and 11 must be made narrower. In that case, the depletion layers generated on the opposing sides of the two juxtaposed trench regions 10 and 11 are connected to each other, causing a punch through which may damage the stored information. Detail information as to the short channel effect which causes the punch through is shown in, for example, "Subthreshold Conduction in MOSFET's", Geoffrey W. Taylor IEEE Transactions on Electron Devices, Vol. ED-26, No. 3, March 1978. Therefore, the conventional device can not always cope with the high integration.

Meanwhile, memory cells having two capacitors provided opposed to each other in a trench are disclosed in Japanese Patent Laying-Open Gazette No. 136256/1986 and in Japanese Patent Laying-Open Gazette No. 187263/1986. However, in the first mentioned prior art, the capacitance is not sufficient since the capacitor regions are formed only in the opposing areas, and in the second mentioned prior art, the manufacturing process is complicated.

SUMMARY OF THE INVENTION

Therefore, a main object of the present invention is to provide a semiconductor memory device and a method for making the same which prevents the damage of storing information due to the punch through and which is suitable for high integration.

The above object of the present invention is accomplished by providing one trench region for two memory cells, in contrast of the conventional memory cell structure in which one trench region is provided for one memory cell.

Briefly stated, the present invention provides a dynamic semiconductor memory device structured such that one trench is formed for two memory cells by forming an element-separating region over the central bottom, so that the side portions of the trench separately form portions for storing charge representing 2 bits, thereby eliminating the opposing side walls of conventional two juxtaposed trenches.

According to a semiconductor memory device of the present invention, since the opposing side walls of two juxtaposed trench regions are eliminated, the damage of information due to the punch through can be depressed to the same level as in the case of a semiconductor memory device having a flat capacitor.

According to a preferred embodiment, one trench region having memory capacitance of 2 bits is formed on the semiconductor substrate, so that a pair of memory cells including a pair of transistors and a pair of capacitors for two memory cells for carrying out reading/writing and storing information represented by charge is formed symmetrically in relation to the center of the trench so that paired memory cells are separated at the central portion on the bottom and the side walls of the trench to form a semiconductor memory device.

By forming the semiconductor memory device as described above, a highly integrated semiconductor memory device can be provided which depresses the degree of damage of information to the conventional level.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
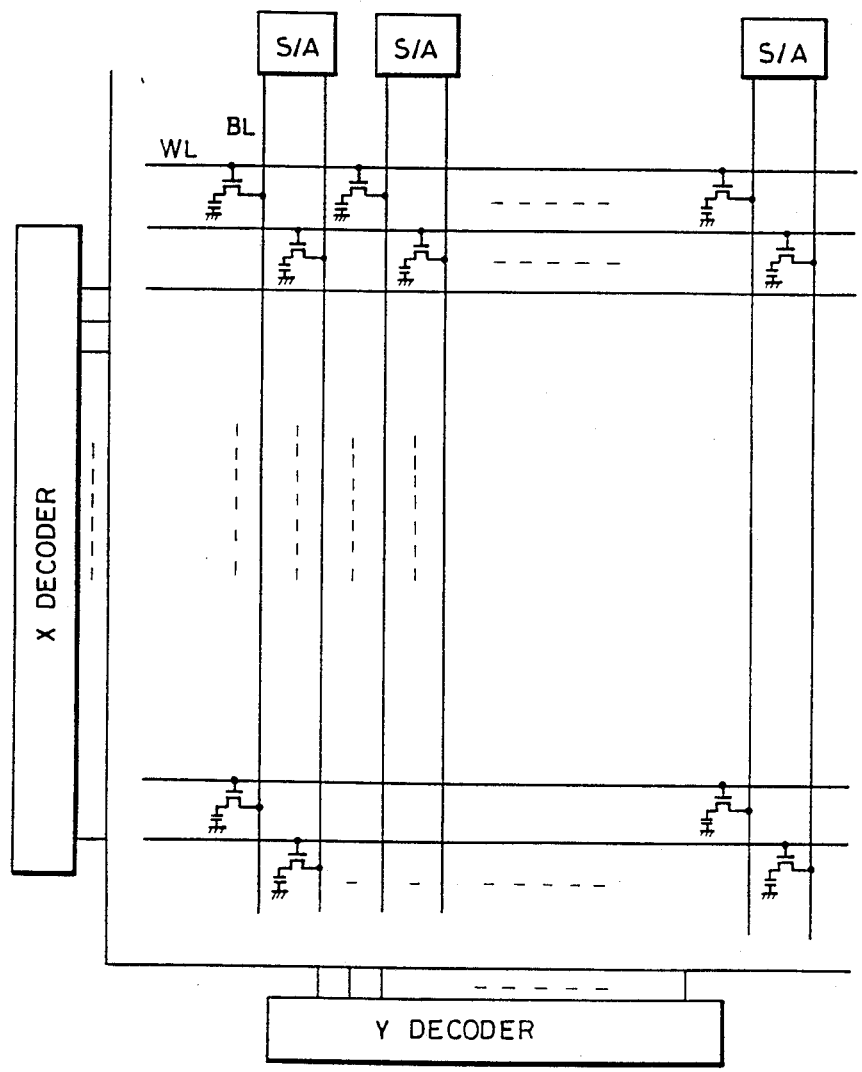
FIG. 1 is a block diagram showing the whole structure of a dynamic semiconductor memory device.
Figure 2A:
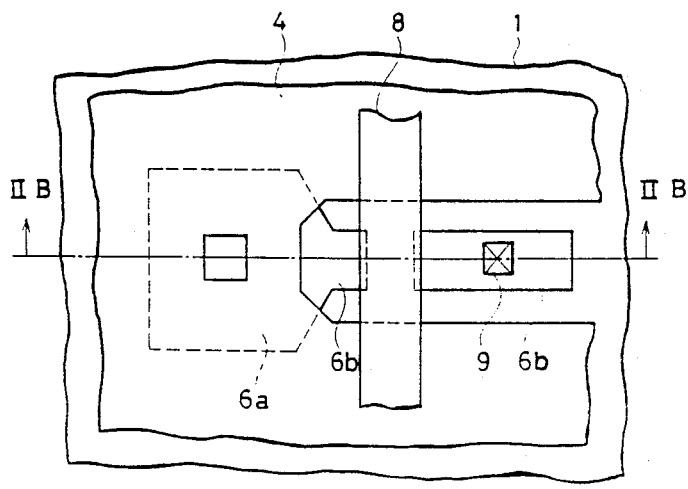
FIGS. 2A and 2B are a plan view and a cross sectional view, respectively, of a conventional semiconductor device having a trench.
Figure 2B:
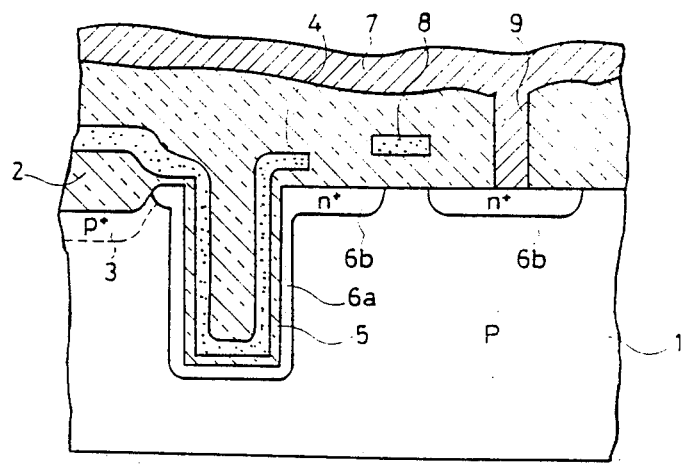
Figure 3A:
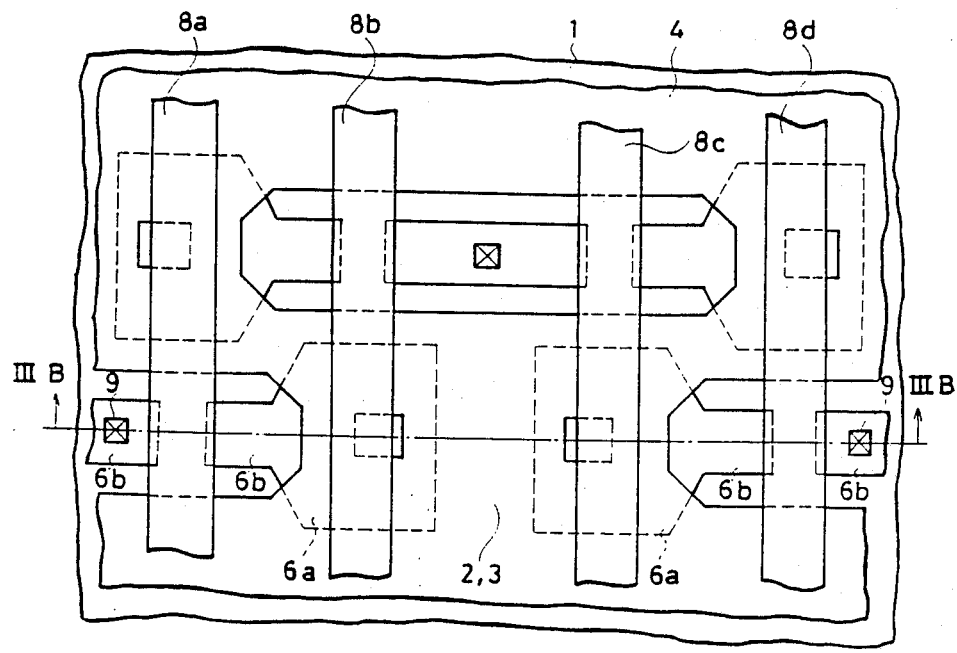
FIGS. 3A and 3B are a plan view and a cross sectional view, respectively, of a semiconductor memory device having a trench region in which it is arranged to be suited for a folded bit line structure.
Figure 3B:
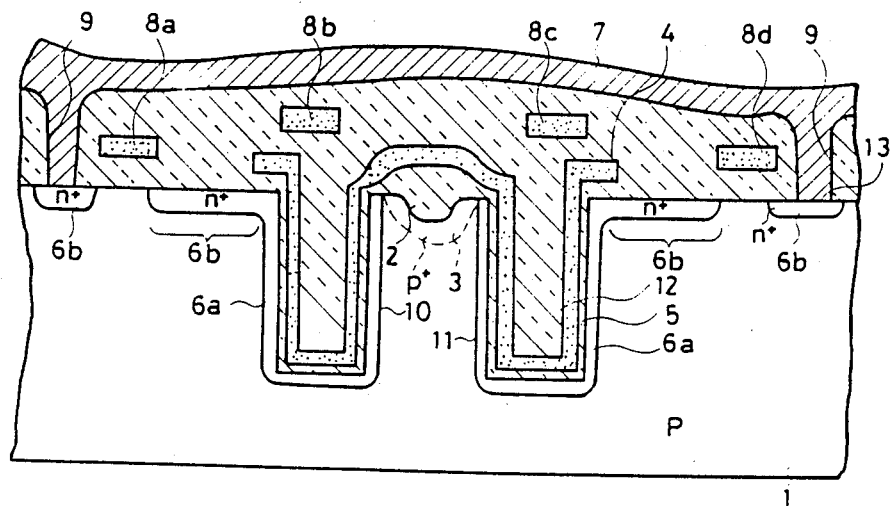
Figure 4A:
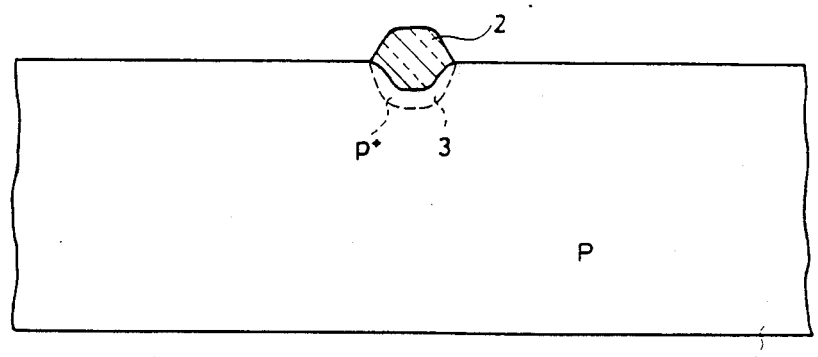
FIGS. 4A to 4C are cross sectional views showing a manufacturing process of a conventional semiconductor memory device having trench regions.
Figure 4B:
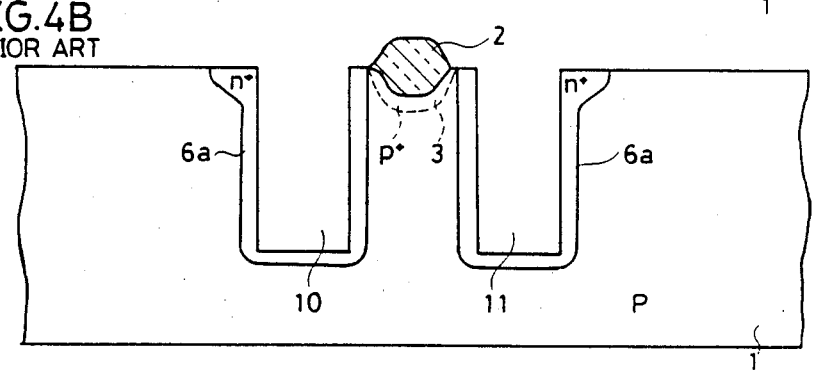
Figure 4C:
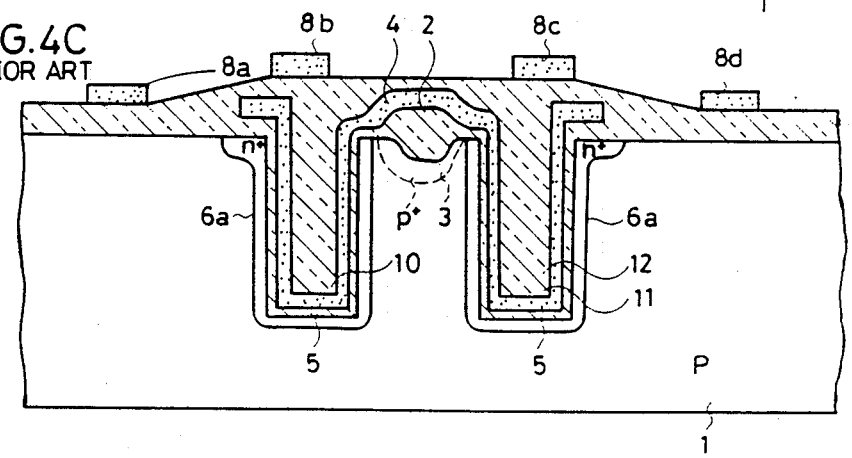
Figure 5A:
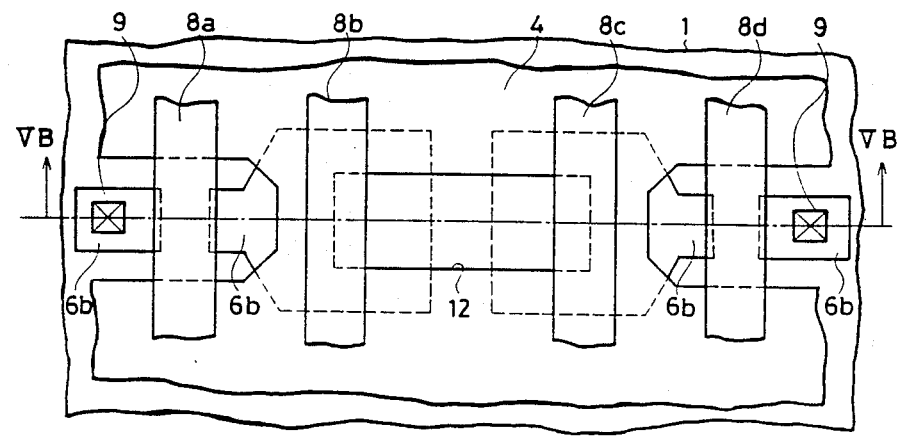
FIGS. 5A and 5B are a schematical plan view and a cross sectional view of a semiconductor memory device according to one embodiment of the present invention.
Figure 5B:
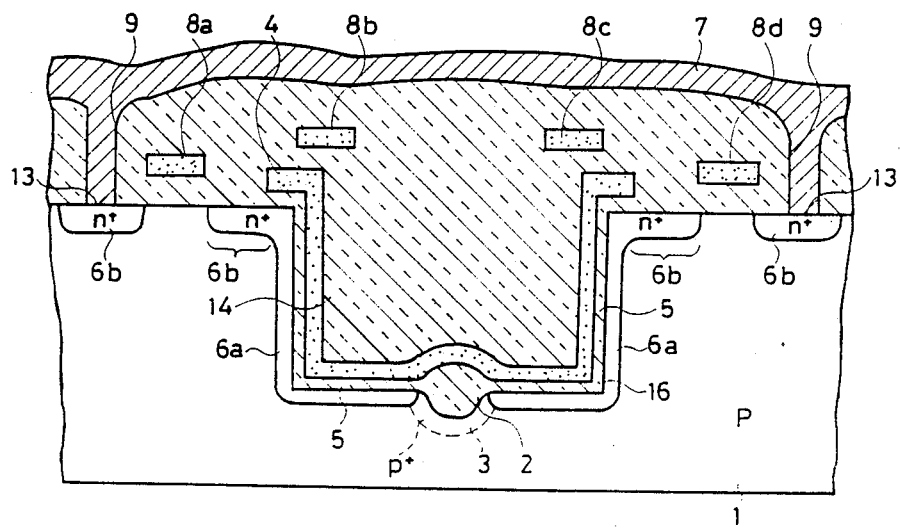
Figure 6A:
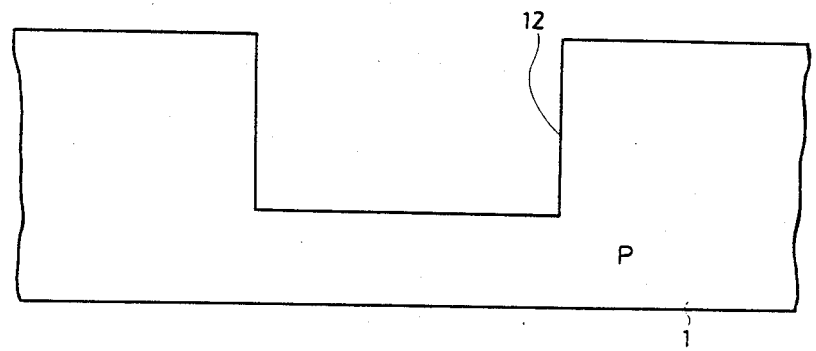
FIGS. 6A to 6C are cross sectional views showing the manufacturing process of the semiconductor memory device according to one embodiment of the present invention.
Figure 6B:
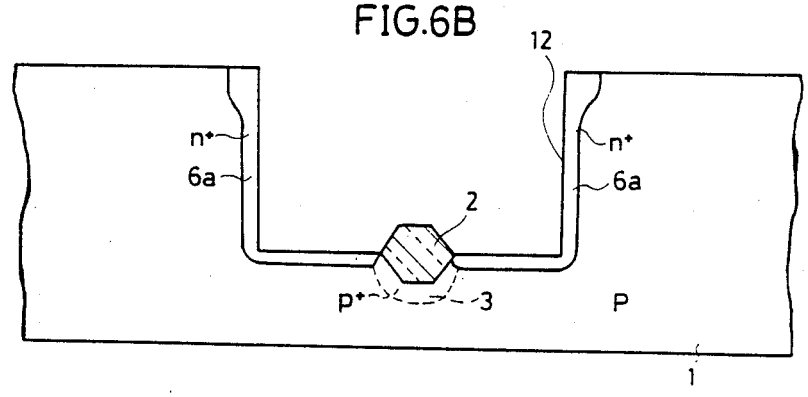
Figure 6C:
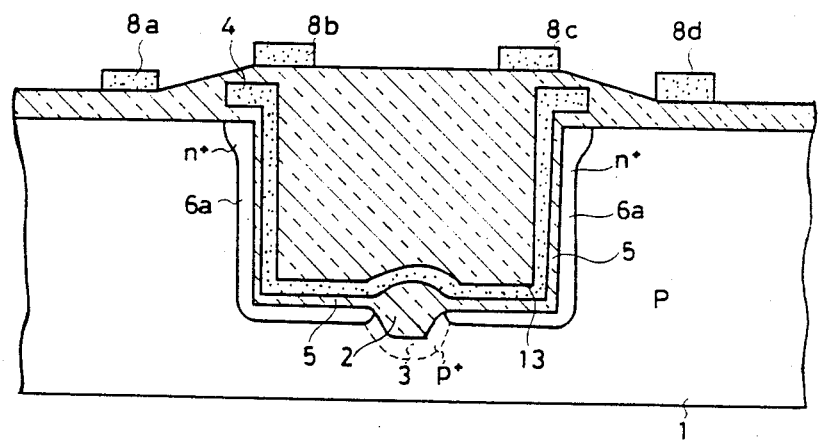

FIG. 5A shows a schematic plan view of a dynamic semiconductor memory device according to one embodiment of the present invention. FIG. 5B is a cross sectional view taken along the line VB—VB of FIG. 5A. These figures correspond to FIGS. 3A and 3B, respectively, of the conventional semiconductor memory device. FIGS. 6A to 6C are cross sectional views showing the manufacturing process of the semiconductor memory device according to the present embodiment, corresponding to FIGS. 4A to 4C. Referring to FIGS. 5A and 5B, the reference numeral 14 denotes one trench region having capacitance for two bits according to the present invention, which were constituted by two trenches 10 and 11 in the conventional semiconductor memory device.

As described above, according to the present invention, the memory cell regions for 2 bits constituted by two trench regions 10 and 11 in the conventional semiconductor memory device come to be structured with one trench region 14 and the memory cells for 2 bits are separated at the center of the bottom and the side walls of the trench region 14. Therefore, the areas of the trench each forming one bit are not opposed to each other at the side walls. Therefore, a possibility of punch through becomes the same level as in the case of a semiconductor memory device having a flat capacitor structure.

The manufacturing steps of the semiconductor memory device according to this embodiment will be hereinafter described with reference to FIGS. 6A to 6C. According to the present embodiment, different from a conventional device, first a trench 14 is formed (FIG. 6A). Then, as in the step shown in FIG. 4A, a p+ type channel stop region 3 for separating elements and a field oxide film 2 are formed and a n+ type diffusion layer 6a is formed (FIG. 6B). The steps following FIG. 6C correspond to the steps following FIG. 4C and the device is manufactured in the same manner.

As described above, according to the present invention, the trench region forming a portion for storing charge representing information for two-bits of memory cells is formed in one trench and elements are separated at the center of the trench on the bottom and on the side walls, thereby eliminating the conventional opposing side walls of the juxtaposed trench regions. Therefore a possibility of damage to the information due to punch through is kept the same as in the case of a memory cell having a flat capacitor structure. Therefore, a highly integrated semiconductor device having high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor memory device comprising the steps of:
   preparing a semiconductor substrate of a predetermined impurity concentration of a certain conductivity type and having a main surface;
   forming on said semiconductor substrate a trench to be used to provide a surface for forming a capacitor thereon for storing information represented by electric charge;
   forming a thick insulating portion for separation extending longitudinally only in the central portion of the bottom surface of said trench, whereby said trench is separated into one lateral half and another lateral half;

forming a first impurity doped region of the opposite conductivity type in the side wall along the entire height thereof and the bottom surface of one lateral half of said trench;

forming a second impurity doped region of the opposite conductivity type in the side wall along the entire height thereof and the bottom surface of the other lateral half of said trench;

forming an insulating layer on the side walls and the bottom surface of said trench and on said first and second impurity doped regions and extending out of said trench onto adjacent surface portions of said semiconductor substrate, wherein said insulating layer is connected to said insulating portion and wherein said first and second impurity doped regions are separated from each other by said insulating portion; and forming a U-shaped conductive layer on said insulating layer on said side walls and across the bottom surface of said trench and oriented to be shared by said first and second impurity doped regions adjacent the sides, said thick insulating portion forming separate capacitors for storing electric charges.

2. A method for manufacturing a semiconductor memory device according to claim 1, further comprising the step of forming semiconductor elements respectively adjacent the ends of said first and second impurity doped regions on the main surface of said semiconductor substrate.

3. A method for manufacturing a semiconductor memory device according to claim 1, further comprising the step of forming a field effect device.

4. A method for manufacturing a semiconductor memory device according to claim 3, wherein said step of forming the field effect device includes the steps of:
forming one electrode and the other electrode with a spacing therebetween and forming an insulated gate above said one electrode and the other electrode, said spacing between said one electrode and the other electrode forming a channel region.

5. A method for manufacturing a semiconductor memory device according to claim 4, wherein said step of forming said one electrode and the other electrode comprises the step of connecting one of said one electrode and the other electrode to said one impurity doped region or to the other impurity doped region.

6. A method for manufacturing a semiconductor memory device according to claim 5, wherein said step of forming said conductor layer comprises the step of forming a polysilicon layer.

7. A method for manufacturing a semiconductor memory device according to claim 6, wherein said step of forming a thick insulating portion for separation comprises the step of forming a field oxide film.

8. A method for manufacturing a semiconductor memory device according to claim 7, wherein said step of forming a thick insulating portion for separation comprises the step of forming an inversion preventing region for preventing inversion below said field oxide film.

9. A method for manufacturing a semiconductor memory device according to claim 8, wherein said step of forming said inversion preventing region comprises the step of forming a region having the same conductivity type as said semiconductor substrate and a higher impurity concentration than said substrate.

10. A method for manufacturing a semiconductor memory device according to claim 9, wherein said step of forming the conductor layer comprises the steps of:
forming a conductor layer in a form having surfaces facing the side walls and the bottom surface of said trench on said insulating film; and
depositing an oxide film on the surface of said trench.

11. A method for manufacturing a semiconductor memory device comprising the steps of:
forming, on a semiconductor substrate (1) having a predetermined impurity concentration of a certain conductivity type, a trench having a surface for forming a capacitor thereon storing information represented by charge, including forming said trench with opposed lateral side walls substantially perpendicular to said main surface of said semiconductor substrate extending from said main surface to a bottom surface of said trench;

bisecting said trench into first and second lateral halves by implanting boron ions into a central portion of said bottom surface of said trench to form a thick insulating portion (3) for separation;

forming a field oxide layer (2) on said thick insulating portion;

forming first and second impurity doped regions (6a) of the opposite conductivity type in said side walls of said trench and bottom surfaces of respective lateral halves of said trench so that said impurity doped regions are contiguous from an upper main substrate surface down along a respective side wall of said trench and onto a respective adjoining lateral bottom surface half of said trench;

forming an insulating layer (5) simultaneously on the side walls and the bottom surface of said trench, on said first and second impurity doped regions (6a), and on surface portions of said substrate adjacent said trench, said insulating layer (5) to said insulating portion (2) and separating said first and second impurity doped regions (6a) from each other by said insulating portion (2); and orienting a U-shaped conductive layer (4) on said insulating layer (5) on said side walls and across the bottom surface of said trench, sharing said U-shaped conductive layer (4) by said first and second impurity doped regions (6a) adjacent the sides of said thick insulating portion and forming separate capacitors for storing electric charges.

12. A method for manufacturing a semiconductor memory device comprising the steps of:
preparing a semiconductor substrate of a predetermined impurity concentration of a certain conductivity type and having a main surface;

forming on said semiconductor substrate a trench to be used to provide a surface for forming a capacitor thereon for storing information represented by charge;

forming a thick insulating portion for separation extending longitudinally only in the central portion of the bottom surface of said trench, whereby said trench is separated into one lateral half and the other lateral half;

forming an insulating layer simultaneously on the side walls, the bottom surface of said trench, and on surface portions of said substrate adjacent said trench, said insulating layer connected to said insulating portion; and forming a U-shaped conductive layer on said insulating layer on said side walls and across the bottom surface of said trench.

13. A method for manufacturing a semiconductor memory device according to claim 12, further comprising the step of forming semiconductor elements on both sides of the trench on the main surface of said semiconductor substrate.

14. A method for manufacturing a semiconductor memory device according to claim 13, wherein step of forming said insulating layer formed on said surface portions of said substrate insulations and separates said semiconductor elements formed on both sides of the trench.

* * * * *